US009118987B2

(12) United States Patent
Pan et al.

(10) Patent No.: US 9,118,987 B2
(45) Date of Patent: Aug. 25, 2015

(54) MOTOR VEHICLE ACTIVE NOISE REDUCTION

(71) Applicant: Bose Corporation, Framingham, MA (US)

(72) Inventors: Davis Y. Pan, Arlington, MA (US); Alaganandan Ganeshkumar, North Attleboro, MA (US)

(73) Assignee: Bose Corporation, Framingham, MA (US)

( * ) Notice: Subject to any disclaimer, the term of this patent is extended or adjusted under 35 U.S.C. 154(b) by 260 days.

(21) Appl. No.: 13/796,644

(22) Filed: Mar. 12, 2013

(65) Prior Publication Data

US 2014/0277930 A1 Sep. 18, 2014

(51) Int. Cl.
*H03B 29/00* (2006.01)
*G10K 11/16* (2006.01)
(Continued)

(52) U.S. Cl.
CPC ................ *H04R 1/00* (2013.01); *G10K 11/178* (2013.01); *G10K 2210/1282* (2013.01); *G10K 2210/3032* (2013.01); *G10K 2210/3033* (2013.01); *G10K 2210/3056* (2013.01); *H04R 1/1083* (2013.01)

(58) Field of Classification Search
CPC ............. B60R 11/0217; G10H 1/0041; G10K 11/175; G10K 11/178; G10K 11/1784; G10K 11/1786; G10K 11/1788; G10K 2210/228; G10K 2210/1282; G10K 2210/3032; G10K 2210/3033; G10K 2210/3056; H03G 3/001; H03G 3/20; H03G 3/32; H03G 7/002; H04N 11/00; H04R 1/00; H04R 1/08; H04R 1/1091; H04R 2410/01; H04R 2410/05; H04R 2499/13; H04R 5/02
USPC ............. 181/210; 381/71.11, 71.14, 73.1, 86, 381/317, 302, 56, 57, 71.1, 71.4, 104, 106, 381/107, 108, 118, 365, 389; 701/36
See application file for complete search history.

(56) References Cited

U.S. PATENT DOCUMENTS

| | | | | |
|---|---|---|---|---|
| 4,247,955 | A * | 1/1981 | Wiedemann | 455/245.2 |
| 4,944,018 | A | 7/1990 | Bose et al. | |

(Continued)

FOREIGN PATENT DOCUMENTS

| | | | |
|---|---|---|---|
| EP | 1906384 | A1 | 4/2008 |
| JP | H0573075 | A | 3/1993 |
| WO | 2011112417 | A1 | 9/2011 |

OTHER PUBLICATIONS

International Search Report issued on Jun. 27, 2014 in corresponding PCT Application No. PCT/US2014/019359.

(Continued)

*Primary Examiner* — Khai N Nguyen
(74) *Attorney, Agent, or Firm* — Brian M. Dingman; Dingman, McInnes + McLane, LLP

(57) ABSTRACT

A device and method that is configured to operate an active noise reduction system for a motor vehicle, where there is an active noise reduction system input signal that is related to the vehicle engine operation, and where the active noise reduction system comprises one or more adaptive filters that output noise reduction signals that are used to drive one or more transducers with their outputs directed to reduce engine noise. The engine harmonic noise level is estimated from the input signal that is related to the vehicle engine operation, and the output of the transducers is limited based on the estimate of the engine harmonic noise level.

14 Claims, 3 Drawing Sheets

(51) Int. Cl.

| | |
|---|---|
| ***H04R 1/00*** | (2006.01) |
| ***G10K 11/178*** | (2006.01) |
| *H04R 1/10* | (2006.01) |

(56) References Cited

U.S. PATENT DOCUMENTS

| | | | | |
|---|---|---|---|---|
| 5,034,984 | A | 7/1991 | Bose | |
| 5,325,437 | A * | 6/1994 | Doi et al. | 381/71.9 |
| 5,434,922 | A | 7/1995 | Miller et al. | |
| 5,485,523 | A * | 1/1996 | Tamamura et al. | 381/71.4 |
| 5,502,770 | A * | 3/1996 | Kuo et al. | 381/71.9 |
| 5,615,270 | A * | 3/1997 | Miller et al. | 381/57 |
| 8,194,873 | B2 | 6/2012 | Pan et al. | |
| 8,204,242 | B2 | 6/2012 | Pan et al. | |
| 8,280,073 | B2 | 10/2012 | Ganeshkumar et al. | |
| 8,306,240 | B2 | 11/2012 | Pan et al. | |
| 8,320,581 | B2 | 11/2012 | Hera et al. | |
| 8,335,318 | B2 | 12/2012 | Pan | |
| 8,355,512 | B2 | 1/2013 | Pan et al. | |
| 2007/0297619 | A1* | 12/2007 | Pan | 381/71.11 |
| 2010/0098263 | A1* | 4/2010 | Pan et al. | 381/71.11 |
| 2010/0239105 | A1* | 9/2010 | Pan | 381/94.9 |
| 2011/0038496 | A1* | 2/2011 | Lott et al. | 381/309 |
| 2012/0177214 | A1 | 7/2012 | Hera et al. | |
| 2013/0093578 | A1* | 4/2013 | Goto | 340/425.5 |
| 2013/0156213 | A1* | 6/2013 | Pan et al. | 381/71.4 |

OTHER PUBLICATIONS

Written Opinion of the International Searching Authority issued on Jun. 27, 2014 in corresponding PCT Application No. PCT/US2014/019359.

* cited by examiner

MOTOR VEHICLE ACTIVE NOISE REDUCTION

FIELD

This disclosure relates to the active reduction of engine noise in a motor vehicle.

BACKGROUND

Engine harmonic cancellation systems are active noise reduction systems that are used in motor vehicles, for example in cabins or in muffler assemblies, to reduce or cancel engine harmonic noise. Engine harmonic cancellation systems use one or more microphones as input transducers. A signal related to the noise to be canceled is also inputted to an adaptive filter. The output of the adaptive filter is applied to one or more transducers that produce sound (i.e., loudspeakers). The sound is acoustically opposite to the undesirable engine sounds that are to be canceled. The adaptive filter can alter the magnitude and/or the frequency of the input signal. The aim of the system is to cancel the microphone signal at the frequency or frequencies of interest. In order to do so, the loudspeaker outputs have a negative gain.

In certain situations these engine harmonic cancellation systems can become unstable and allow the loudspeaker sound output levels that are designed to cancel the engine noise to diverge. Such an unstable engine harmonic cancellation system can produce loud and noticeable noise artifacts. One cause of such instability can be a change in the transfer function of the vehicle cabin, which can cause the loudspeaker output gain to effectively become positive.

SUMMARY

The system, device and method of this disclosure are effective to minimize the audible artifacts due to an unstable engine harmonic cancellation system. This is accomplished by estimating the engine harmonic noise level based on signals that are related to the vehicle engine operation, such as RPM, torque, or a computed engine load. The engine harmonic cancellation system output level is then limited to the minimum necessary to cancel these estimated engine harmonic noise levels. As a result, when the system becomes unstable the engine harmonic cancellation system output does not become louder than the approximate level of engine noise.

All examples and features mentioned below can be combined in any technically possible way.

In one aspect, a method for operating an active noise reduction system for a motor vehicle, where there is an active noise reduction system input signal that is related to the vehicle engine operation, and where the active noise reduction system comprises one or more adaptive filters that output noise reduction signals that are used to drive one or more transducers with their outputs directed to reduce engine noise, includes estimating the engine harmonic noise level from the input signal that is related to the vehicle engine operation, and limiting the output of the transducers based on the estimate of the engine harmonic noise level. The transducer outputs can be directed in to the vehicle cabin or another vehicle location in which noise is being cancelled, such as the muffler system.

Embodiments may include one of the following features, or any combination thereof. The output of the transducers may be limited to a level that is calculated to cancel the engine harmonic noise in the cabin or other vehicle location in which noise is being cancelled, such as the muffler system. A system input signal may be related to the engine RPM. The active noise reduction system can also include a computer memory that stores relationships between the transducer voltage level and the resulting engine noise level cancelled as a function of transducer output frequency. An input signal can be an engine harmonic noise frequency. The limiting step can include determining the transducer voltage level that is needed to cancel the estimated engine harmonic noise level at the input engine harmonic noise frequency. The active noise reduction system can also include a computer memory that stores relationships between the engine load and the resulting sound pressure level as a function of engine harmonic noise frequency.

In another aspect, a device configured to control the operation of an active noise reduction system for a motor vehicle cabin, where there is an active noise reduction system input signal that is related to the vehicle engine operation, and where the active noise reduction system comprises one or more adaptive filters that output noise reduction signals that are used to drive one or more transducers with their outputs directed to reduce engine noise, can include a processor that is configured to estimate the engine harmonic noise level from the input signal that is related to the vehicle engine operation, and limit the output of the transducers based on the estimate of the engine harmonic noise level. The transducer outputs can be directed in to the vehicle cabin or another vehicle location in which noise is being cancelled, such as the muffler system.

Embodiments may include one of the following features, or any combination thereof. The output of the transducers may be limited to a level that is calculated to cancel the engine harmonic noise. A system input signal can be related to the engine RPM. The active noise reduction system can further include a computer memory that stores relationships between the transducer voltage level and the resulting engine noise level cancelled as a function of transducer output frequency. An input signal can include an engine harmonic noise frequency. The output of the transducers may be limited by determining the transducer voltage level that is needed to cancel the estimated engine harmonic noise level that the input engine harmonic noise frequency. The active noise reduction system can further include a computer memory that stores relationships between the engine load and the resulting sound pressure level as a function of engine harmonic noise frequency.

DETAILED DESCRIPTION

Figure 1:
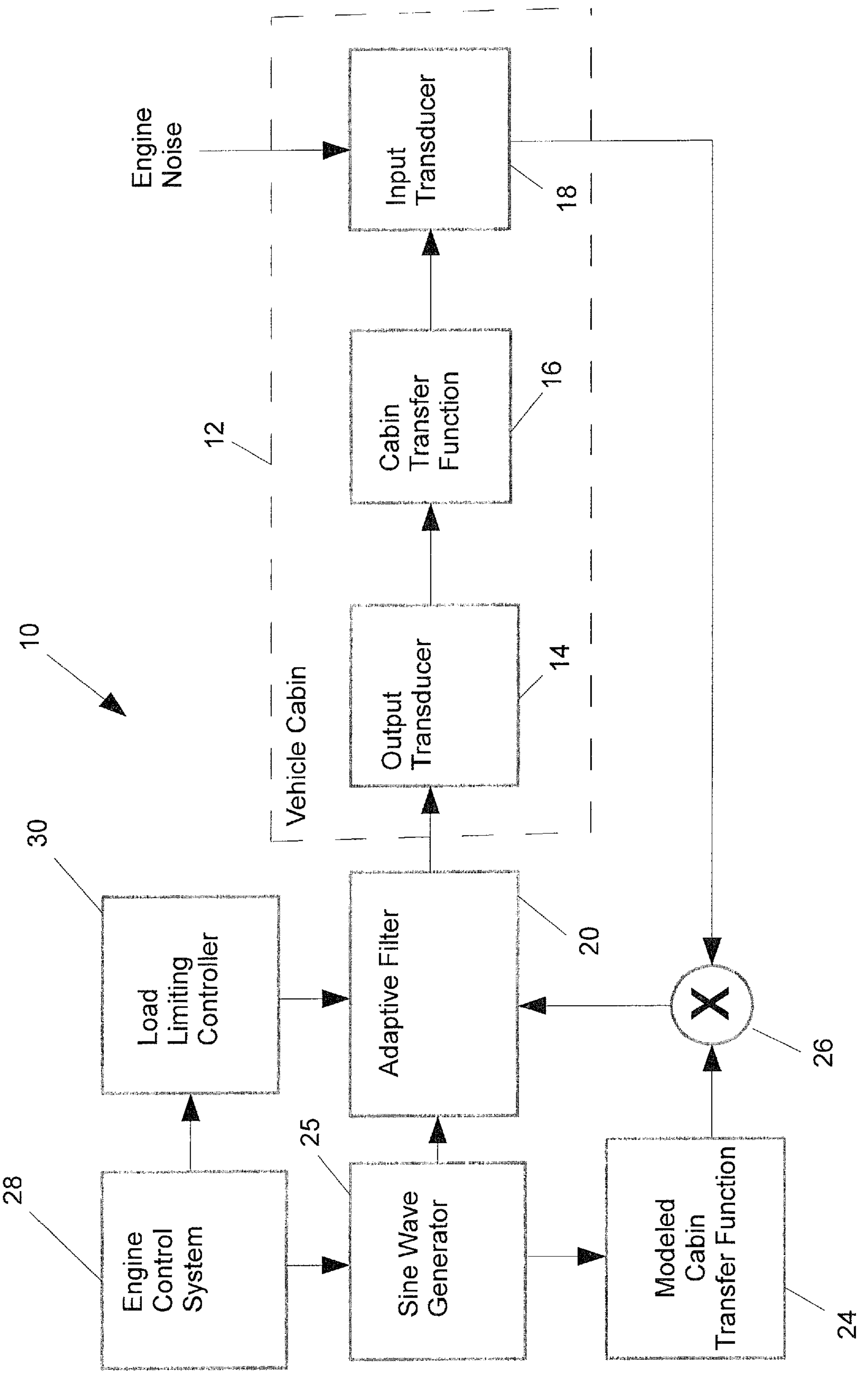
FIG. 1 is a schematic block diagram of an engine harmonic cancellation system that can be used to accomplish the system, device and method of the present innovation.

Elements of FIG. 1 of the drawings are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

FIG. 1 is a simplified schematic diagram of an engine harmonic cancellation system 10 that embodies the disclosed innovation. System 10 uses adaptive filter 20 that supplies signals to one or more output transducers 14 that have their outputs directed into vehicle cabin 12. The output of the transducers, as modified by the cabin transfer function 16, is picked up by an input transducer (e.g., microphone) 18. Engine noise in the vehicle cabin is also picked up by input transducer 18. Existing vehicle engine control system 28 supplies one or more input signals that are related to the vehicle engine operation. Examples include RPM, torque, accelerator pedal position, and manifold absolute pressure (MAP). A load limiting controller or processor 30 and sine wave generator 25 are input with the signal(s) from engine control system 28 that relate to vehicle engine operation, and from which the engine harmonics to be canceled can be determined. Controller 30 estimates the instantaneous harmonic level of the engine noise to be cancelled based on these input signals. This estimate is provided as a control signal to adaptive filter 20. Sine wave generator 25 provides to adaptive filter 20 a noise reduction reference signal that is also provided to modeled cabin transfer function 24 to produce a revised reference signal. The revised reference signal and the microphone output signals are multiplied together 26, and provided as an input to adaptive filter 20.

Controller 30 provides to adaptive filter 20 signals that are effective to limit the output of transducer 14 based on the estimate of the engine harmonic noise level. The result is that the system is configured to output a level of sound that is no greater than the estimated level of engine noise in vehicle cabin 12. Thus, even if system 10 becomes unstable, the sound pressure created by output transducer 14 is not louder than that of the engine.

One result of the subject innovation is that the engine harmonic cancellation system does not need to be turned off when it diverges. Another benefit is that detectable noise artifacts due to system instability are minimized. The innovation can also decrease other artifacts of an engine harmonic cancellation system such as voice echoes and afterglow (temporary noise gain when the engine noise drops suddenly). Also, tuning for engine harmonic cancellation system instability countermeasures becomes easier and faster since the consequence of an improperly tuned instability threshold is less dire. For example, if the threshold is set too low the result would be slightly less noise cancellation instead of erroneous shutting down of the noise control system. If the threshold is too high, the system output would become slightly louder when it diverged instead of continuously producing very loud and unacceptable noise artifacts.

A non-limiting example of a manner in which the innovation can operate is illustrated with reference to FIGS. 2 and 3.

Figure 2:
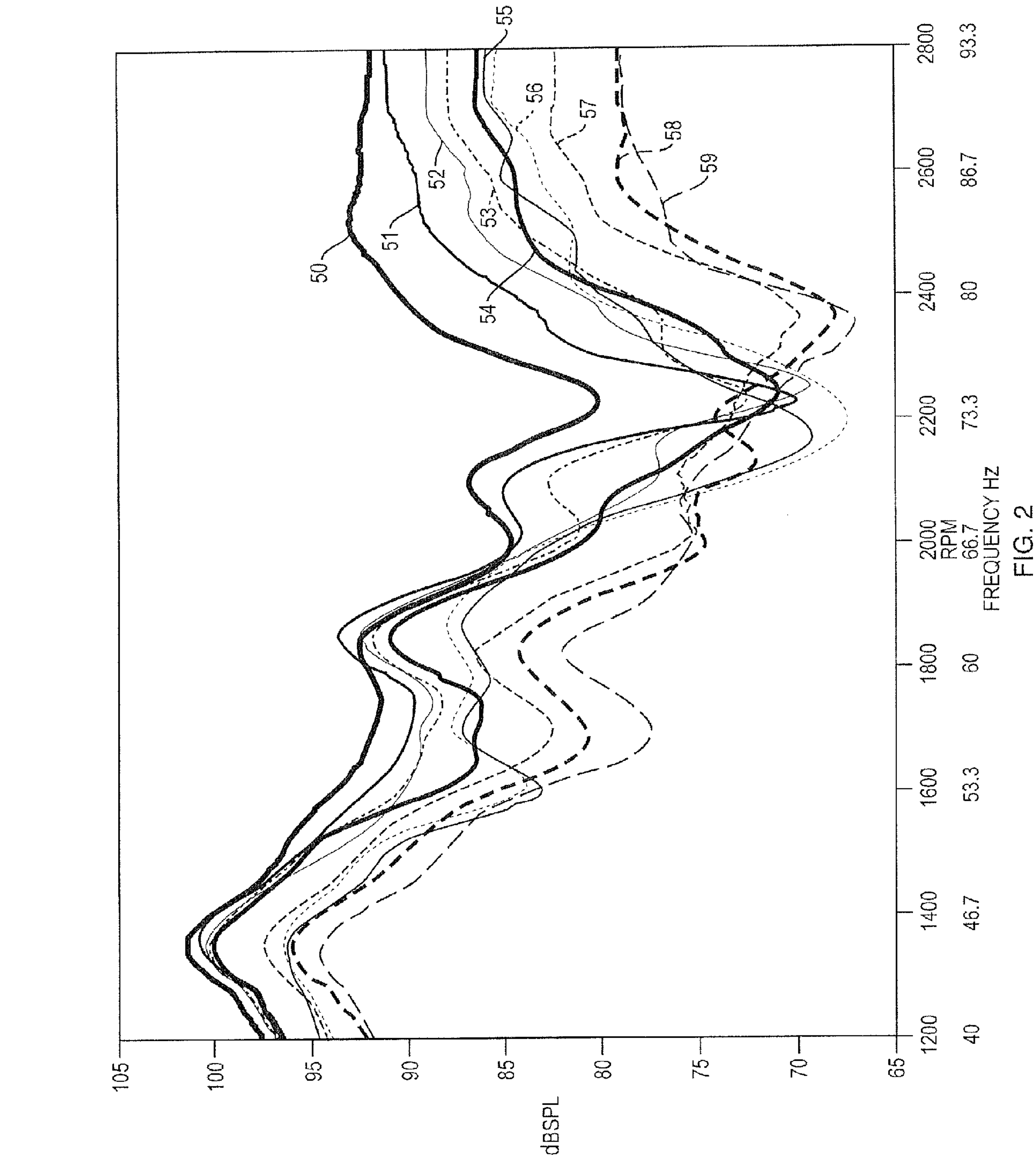
FIG. 2 illustrates a series of engine load curves. The engine noise sound pressure level for each of these engine loads are set forth as a function of the frequency of the engine noise.

FIG. 2 illustrates a series of ten engine load curves labeled 50-59. The engine noise sound pressure level for each of these ten engine loads is graphed as a function of the frequency of the engine noise. Curve 50 illustrates a 94% engine load. Curves 51-59 illustrate engine loads of 88%, 83%, 78%, 73%, 67%, 62%, 58%, 49%, and 39%, respectively. The engine RPM that corresponds to the particular noise frequency is also set out along the X axis.

Figure 3:
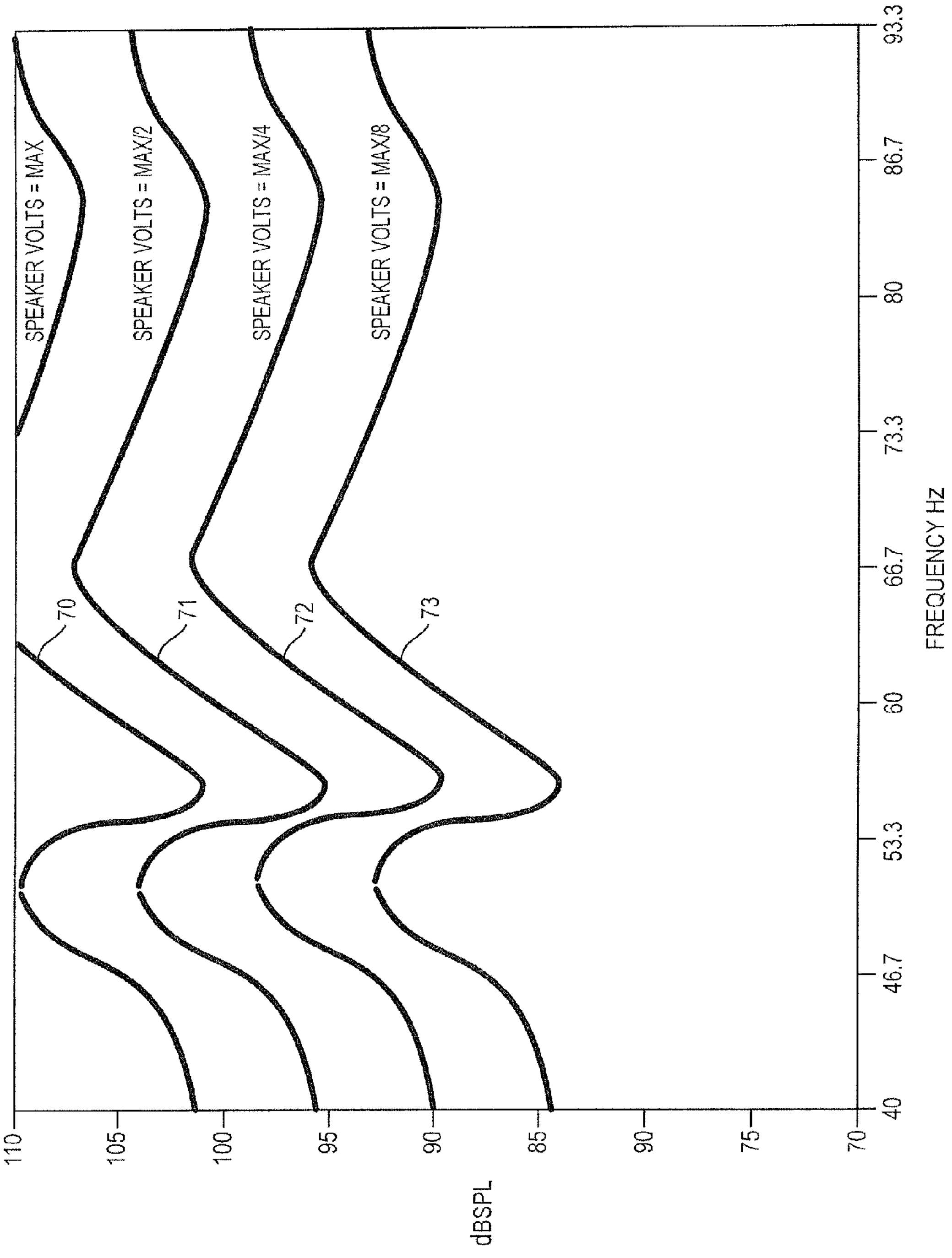
FIG. 3 illustrates a series of speaker voltage curves. The speaker output sound pressure levels as a function of output frequency are set forth at each of the speaker voltage levels

FIG. 3 illustrates a series of four curves 70-73 that illustrate speaker output sound pressure levels as a function of output frequency at the four illustrated speaker voltage levels: maximum voltage, one half maximum, one quarter maximum, and ⅛ maximum, respectively. These curves are illustrative, not limiting, as system 10 can have in its computer memory data that represents the relationships illustrated by one or more such curves, depending on the level of sound control limitation that is desired to be accomplished. The data could be stored in look-up tables, for example.

In this example, the engine load is a signal that is inputted to controller 30 from engine control system 28. Controller 30 also receives (or determines based on the inputs from engine control system 28) the frequency of the engine noise to be canceled. To determine the speaker voltage level that is required to generate an output that is at about the level of the engine noise in the cabin at the subject frequency, the voltage curve 70-73 which produces the sound pressure level (SPL) which matches the engine noise level at the subject frequency is determined. For example, at 46.7 Hz at an engine load of 94% (curve 50, FIG. 2), the engine noise SPL is about 100 dB. Looking at FIG. 3, at this same frequency a speaker voltage of about one half maximum (curve 71) is appropriate to generate a transducer SPL of about 100 dB. Thus, controller 30 limits the output of transducer 14 to one half the maximum voltage in order to produce an SPL that approximately matches the engine harmonic noise SPL in the cabin.

From this it can be seen that knowing the frequency and the engine load, and with a predetermination of the speaker SPL at various speaker input voltages, controller 30 can limit the output of the engine harmonic cancellation system 10 such that it is at about the same level as the engine noise in the cabin at the frequency of interest. Thus, for example, if the engine is idling the output of the engine harmonic cancellation system is at a very low level so as to be almost inaudible. As a result, even if the system becomes unstable noticeably loud noise artifacts are avoided. Thus, even if the system becomes unstable it is not necessary to turn the system off as is sometimes done at present.

FIGS. 2 and 3 would apply mainly to a single speaker cancellation system. In most cases an active noise cancellation system would use multiple loudspeakers and/or multiple microphones. In a multiple speaker cancellation system the output limit may be different than as described above. With multiple speakers, some speakers may add constructively or destructively and behave differently as a function of frequency. The fact that each speaker may be independently driven by a unique adaptive filter and/or the noise level is monitored at multiple microphones also complicates the ultimate system SPL level. In such cases, instead of a voltage to SPL table as described above the system could record the voltage required by the system to cancel a certain noise SPL level. At frequencies where speakers add constructively, the voltage will be less than the voltage required for a single speaker. At frequencies where speakers add destructively, the voltage will be higher.

The above was described relative to noise cancellation in a vehicle cabin. However, the disclosure applies as well to noise cancellation in other vehicle locations. One additional example is that the system can be designed to cancel noise in a muffler assembly. Such noise may be engine harmonic noise but may also be other engine-operation related noise, as is known in the art.

Embodiments of the devices, systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

The various features of the disclosure could be enabled in different manners than those described herein, and could be combined in manners other than those described herein. A number of implementations have been described. Nevertheless, it will be understood that additional modifications may be made without departing from the scope of the inventive concepts described herein, and, accordingly, other embodiments are within the scope of the following claims.

What is claimed is:

1. A method for operating an active noise reduction system for a motor vehicle that has an engine, where there is an active noise reduction system input signal that is related to the vehicle engine operation, and where the active noise reduction system comprises one or more adaptive filters that output noise reduction signals that are used to drive one or more transducers with their outputs directed to reduce engine noise, a computer memory, that stores relationships between the transducer voltage level and the resulting engine noise level cancelled as a function of transducer output frequency, and that stores relationships between the engine load and the resulting sound pressure level as a function of an engine harmonic noise frequency, the method comprising:

estimating the engine harmonic noise level from the input signal that is related to the vehicle engine operation; and limiting the output of the transducers based on the estimate of the engine harmonic noise level.

2. The method of claim 1 wherein the output of the transducers is limited to a level that is calculated to cancel the engine harmonic noise.

3. The method of claim 1 wherein an input signal is related to the engine revolutions per minute (RPM).

4. The method of claim 1 wherein an input signal comprises the engine harmonic noise frequency.

5. The method of claim 4 wherein the limiting step comprises determining the transducer voltage level that is needed to cancel the estimated engine harmonic noise level at the engine harmonic noise frequency.

6. The method of claim 1 wherein the transducer outputs are directed into the vehicle cabin.

7. A device configured to control the operation of an active noise reduction system for a motor vehicle that has an engine, where there is an active noise reduction system input signal that is related to the vehicle engine operation, and where the active noise reduction system comprises one or more adaptive filters that output noise reduction signals that are used to drive one or more transducers with their outputs directed to reduce engine noise, the device comprising:

a computer memory, that stores relationships between the transducer voltage level and the resulting engine noise level cancelled as a function of transducer output frequency, and that stores relationships between the engine load and the resulting sound pressure level as a function of an engine harmonic noise frequency;

a processor that is configured to:

estimate the engine harmonic noise level from the input signal that is related to the vehicle engine operation; and limit the output of the transducers based on the estimate of the engine harmonic noise level.

8. The device of claim 7 wherein the output of the transducers is limited to a level that is calculated to cancel the engine harmonic noise.

9. The device of claim 7 wherein an input signal is related to the engine revolutions per minute (RPM).

10. The device of claim 7 wherein an input signal comprises the engine harmonic noise frequency.

11. The device of claim 10 wherein the output of the transducers is limited by determining the transducer voltage level that is needed to cancel the estimated engine harmonic noise level at the input-engine harmonic noise frequency.

12. The device of claim 7 wherein the transducer outputs are directed into the vehicle cabin.

13. The method of claim 1 wherein the motor vehicle has a plurality of independently driven transducers with their outputs directed to reduce engine noise, and wherein the stored relationships between the transducer voltage level and the resulting engine noise level cancelled as a function of transducer output frequency comprises the voltage required to cancel certain engine noise sound pressure levels.

14. The device of claim 7 wherein the motor vehicle has a plurality of independently driven transducers with their outputs directed to reduce engine noise, and wherein the stored relationships between the transducer voltage level and the resulting engine noise level cancelled as a function of transducer output frequency comprises the voltage required to cancel certain engine noise sound pressure levels.

* * * * *